United States Patent
Filoteo, Jr. et al.

(10) Patent No.: US 8,021,931 B2
(45) Date of Patent: Sep. 20, 2011

(54) DIRECT VIA WIRE BONDING AND METHOD OF ASSEMBLING THE SAME

(75) Inventors: Dario S. Filoteo, Jr., Singapore (SG); Emmanuel A. Espiritu, Singapore (SG)

(73) Assignee: Stats Chippac, Inc., Fremont, CA (US)

( * ) Notice: Subject to any disclaimer, the term of this patent is extended or adjusted under 35 U.S.C. 154(b) by 128 days.

(21) Appl. No.: 11/943,290

(22) Filed: Nov. 20, 2007

(65) Prior Publication Data
US 2008/0136022 A1     Jun. 12, 2008

Related U.S. Application Data

(60) Provisional application No. 60/869,521, filed on Dec. 11, 2006.

(51) Int. Cl.
*H01L 29/72* (2006.01)
(52) U.S. Cl. ........ 438/125; 438/614; 438/637; 438/666; 257/738; 257/739; 257/750; 257/774; 257/780
(58) Field of Classification Search ................. 174/259, 174/266; 438/125, 614, 637, 666; 257/738, 257/739, 750, 774, 780; 29/800
See application file for complete search history.

(56) References Cited

U.S. PATENT DOCUMENTS

| | | | |
|---|---|---|---|
| 5,216,278 A * | 6/1993 | Lin et al. | 257/688 |
| 6,079,610 A * | 6/2000 | Maeda et al. | 228/180.5 |
| 6,084,295 A * | 7/2000 | Horiuchi et al. | 257/690 |
| 6,787,896 B1 * | 9/2004 | Petty-Weeks | 257/700 |
| 7,042,098 B2 | 5/2006 | Harun et al. | |
| 7,053,489 B2 | 5/2006 | Kraus et al. | |
| 7,312,523 B2 * | 12/2007 | Audet et al. | 257/700 |
| 7,387,917 B2 * | 6/2008 | Choi et al. | 438/125 |
| 2002/0014004 A1 * | 2/2002 | Beaman et al. | 29/842 |
| 2003/0089758 A1 * | 5/2003 | Lee | 228/4.5 |
| 2004/0262039 A1 * | 12/2004 | Taggart et al. | 174/262 |

OTHER PUBLICATIONS

John Baliga, "Via Lands Double as Bonding Pads," *Semiconductor International*, pp. 1-3, 2006 <http://www.reed.electronics.com/semiconductor/article/CA6329047.html>.

* cited by examiner

*Primary Examiner* — Edward Wojciechowicz

(57) ABSTRACT

A method for electrically connecting an integrated circuit to a via in a substrate is disclosed. The method can include deforming a ball over the via to form a bump and attaching a bond wire to the bump. The method also can include attaching the bond wire to the integrated circuit, such as by forming an end of the bond wire into a second ball and deforming the second ball over the integrated circuit. Alternatively, the method can include forming an end of the bond wire into a ball and deforming the ball over the via. Embodiments of a disclosed integrated circuit and substrate assembly can include, for example, a bump aligned with at least a portion of a via in a substrate and a bond wire attached to the integrated circuit and the bump. Other embodiments can include a via with a top metal cap and an upper plating.

25 Claims, 5 Drawing Sheets

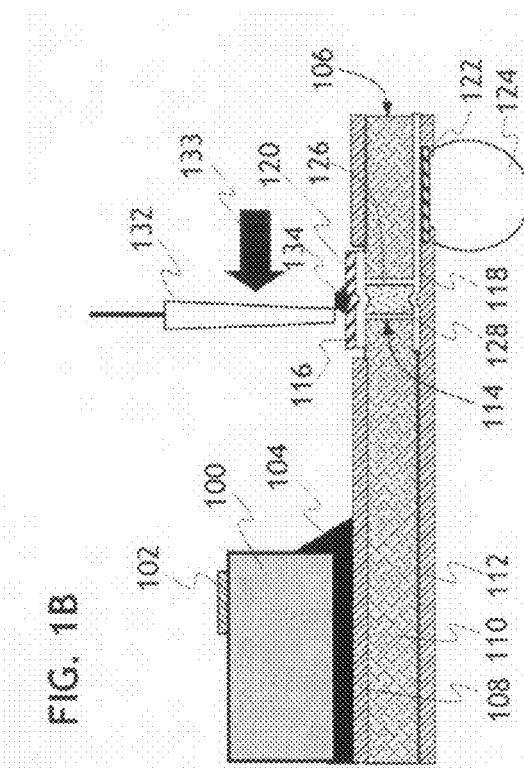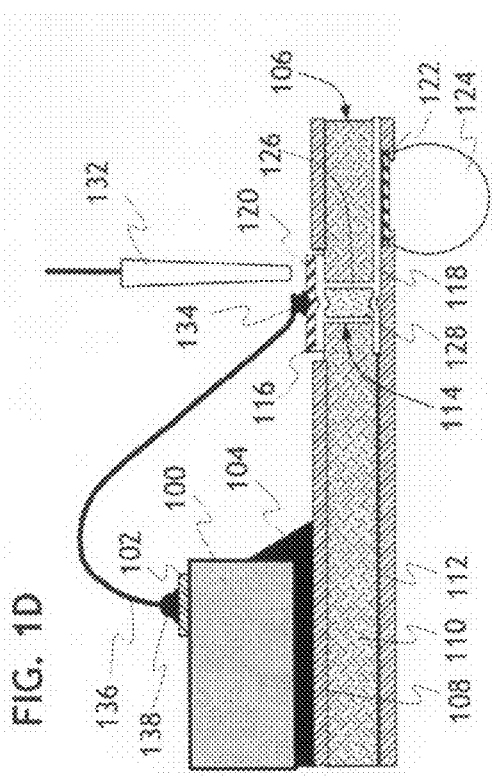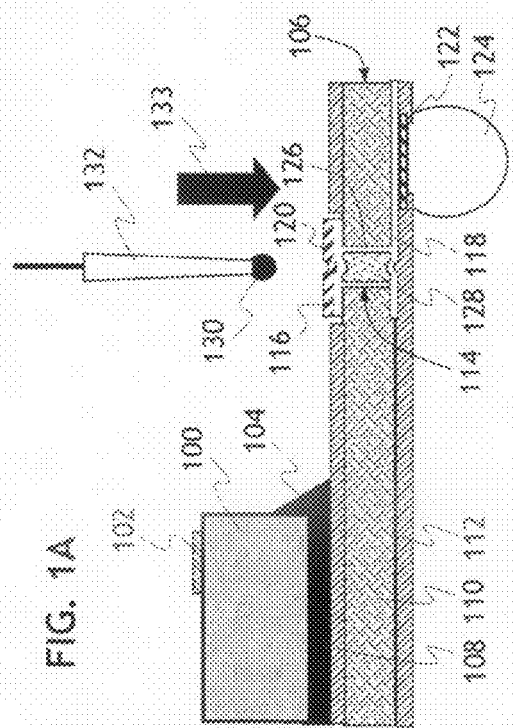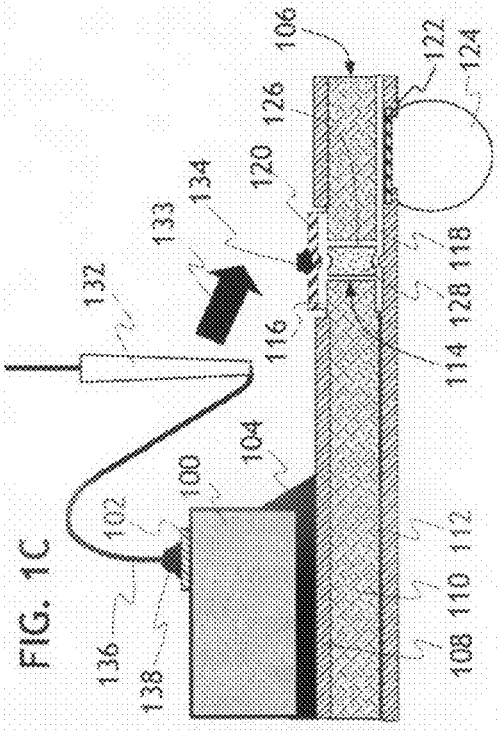

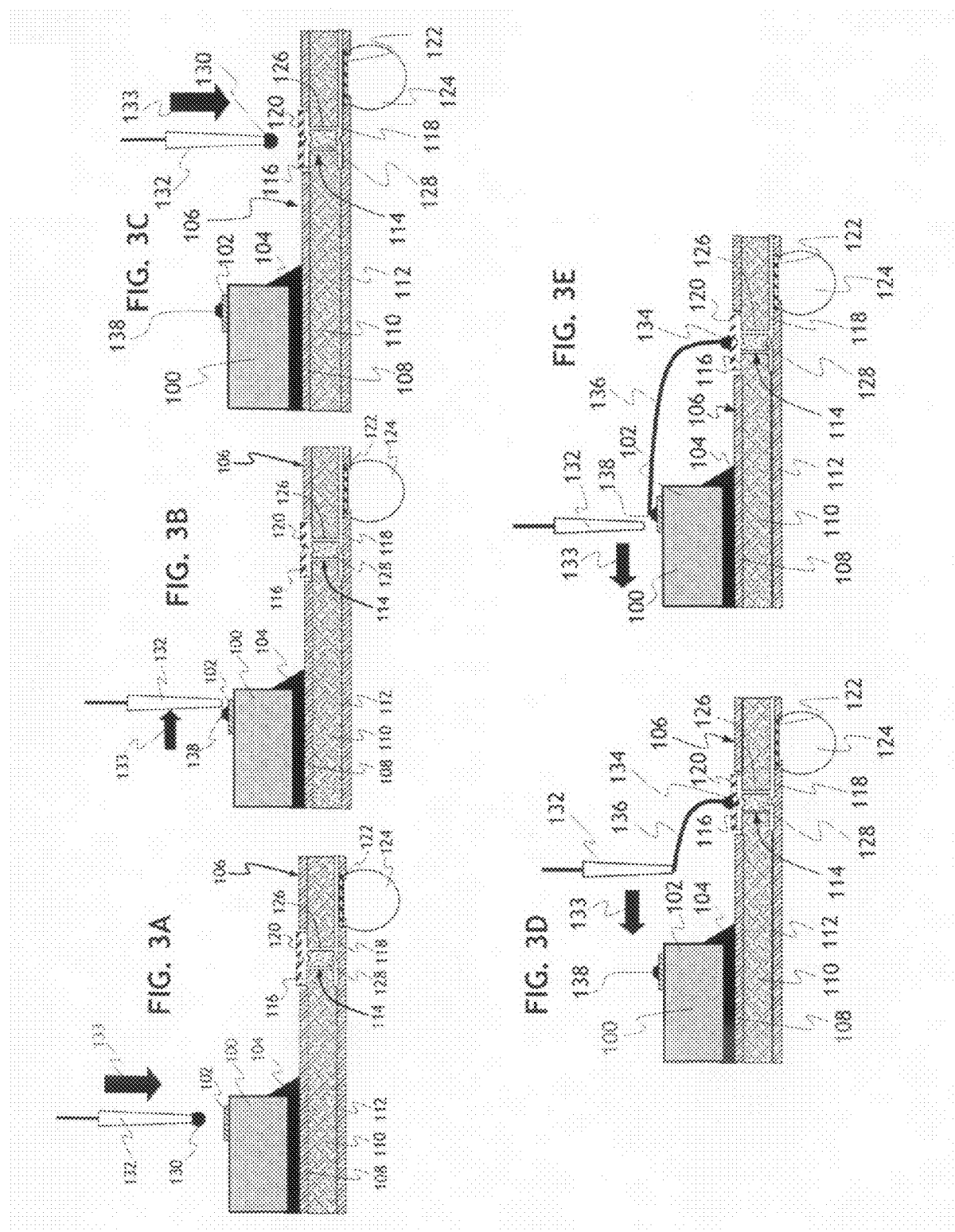

DIRECT VIA WIRE BONDING AND METHOD OF ASSEMBLING THE SAME

CROSS REFERENCE TO RELATED APPLICATIONS

This application claims the benefit of the earlier filing date of U.S. provisional patent application No. 60/869,521 entitled "Direct Via Wire Bonding," which was filed on Dec. 11, 2006, and is incorporated herein by reference in its entirety.

FIELD

The disclosure relates to wire bonding over vias in integrated circuit packages.

BACKGROUND

Integrated circuit packages enclose and protect integrated circuits while allowing for communication between the integrated circuits and external devices. For example, most conventional packages include a substrate on which an integrated circuit is mounted. Vias are used to connect points (e.g., bumps or pins) on an external or interior surface of the substrate to points on an internal surface of the substrate. Forming vias typically includes drilling holes (e.g., by laser) and then introducing a conductive material into the holes (e.g., by plating the holes or by inserting conductive rivets into the holes). Conventional packages typically include traces connecting the vias to wire bond pads on an internal surface of the substrate. Bond wires connect the bond pads on the internal surface of the substrate to bond pads on a surface of the mounted integrated circuit.

In contrast to conventional devices, U.S. Pat. No. 7,042,098 discloses a package including "vias have[ing] a via capture pad to which a wire may be wire bonded so that the wires from the [integrated circuit] to the substrate top side directly contact the vias at their capture pads without the need for traces from a top side bond pad to a via" (abstract).

U.S. Patent Application Publication No. 2004/0262039 discloses "a first wire-bond pad and a first via that is disposed directly below the first wire-bond pad in the ... wire-bonding substrate" (abstract).

U.S. Pat. No. 7,053,489 discloses an arrangement where "a nail head contact is applied directly to a support surface at the site of the through-plating, without further metallization being present on the surface." Col. 2 lines 4-7. The '489 patent further emphasizes that "only the hole through the support to form the through-plating is metallized" in order to "avoid the need for an expensive substrate surface." Col. 2 lines 7-8 and 16-17.

These prior art references, however, fail to address technical challenges associated with direct wire bonding to vias.

SUMMARY

Disclosed herein is a method for electrically connecting an integrated circuit to a via in a substrate. Some disclosed embodiments of the method allow for stable and reliable direct wire bonding to vias even if the vias have uneven surfaces. Embodiments of the method can include deforming a ball over a via cap to form a bump. For example, the via cap can include an indentation and deforming the ball over the via cap can substantially fill the indentation. The via cap can also include a metal plating covering the top of the via cap. Some embodiments provide for a blind via or a wedge via.

Certain disclosed embodiments also can include attaching a bond wire to the bump. These embodiments also can include attaching the bond wire to the integrated circuit, such as by forming an end of the bond wire into a second ball and deforming the second ball over the integrated circuit. Attaching the bond wire to the bump can include forming a wedge bond or a stitch bond between the bond wire and the bump.

Additional embodiments of the disclosed method can include deforming a ball over the integrated circuit (rather than the via cap) to form a bump. These embodiments also can include forming an end of the bond wire into a ball, deforming the ball over the via cap in the substrate and/or attaching the bond wire to the bump over the integrated circuit. Similar to attaching the bond wire to the bump over the via cap, attaching a bond wire to the bump over the integrated circuit can include, for example, forming a wedge bond or a stitch bond between the bond wire and the bump.

Also disclosed are embodiments of an integrated circuit and substrate assembly. Embodiments of the assembly can include, for example, a substrate with a via (e.g., a blind via) electrically connecting a metal layer on a first surface of the substrate to a metal layer on a second surface of the substrate and an integrated circuit mounted over the first surface of the substrate. The assembly also can include a bump substantially aligned with at least a portion of the via and a bond wire attached to the integrated circuit and the bump. In embodiments including a plurality of vias, the first surface of the substrate can include substantially no lateral traces connected to the vias.

Other embodiments of an integrated circuit and substrate assembly can include a substrate with at least a first surface and a second surface, as well as a via with a top metal cap. In some embodiments, the substrate comprises multiple layers and the via can extend through all of the layers. The via can also include a bottom metal cap, and the substrate assembly can include a bottom metal layer electrically connected to the bottom metal cap. In some embodiments, a second surface of the substrate is not metallized, and the bottom metal layer can be electrically connected to an external bump.

BRIEF DESCRIPTION OF THE DRAWINGS

FIGS. 1A-1D are cross-sectional profile views of products formed by steps in a first embodiment of the disclosed method for connecting a via in a substrate to an integrated circuit.

FIGS. 3A-3E are cross-sectional profile views of products formed by steps in a second embodiment of the disclosed method for connecting a via in a substrate to an integrated circuit.

DETAILED DESCRIPTION

Figure 2A:
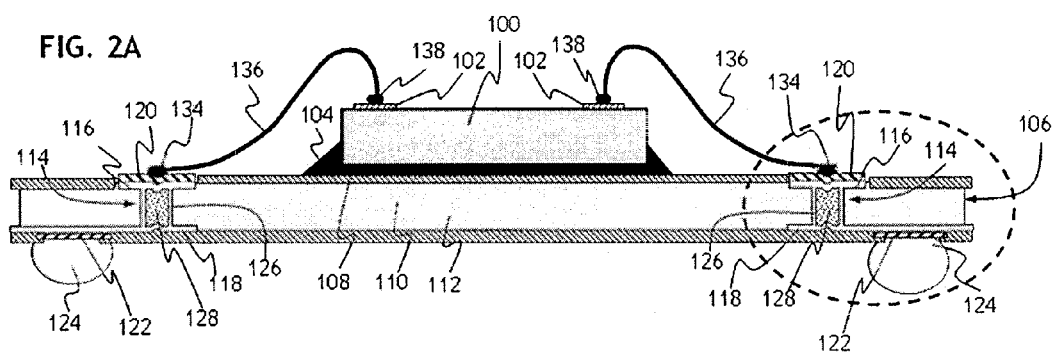
FIG. 2A is a cross-sectional profile view of an integrated circuit and substrate assembly made by one embodiment of the method, as shown in FIGS. 1A-1D.

Unless otherwise explained, all technical and scientific terms used herein have the same meaning as commonly understood by one of ordinary skill in the art to which this disclosure belongs. The singular terms "a," "an," and "the"

include plural referents unless the context clearly indicates otherwise. Similarly, the word "or" is intended to include "and" unless the context clearly indicates otherwise. The term "includes" means "comprises." Directional terms, such as "upper," "lower," "front," "back," "vertical," and "horizontal," are used herein to express and clarify the relationship between various elements. It should be understood that such terms do not denote absolute orientation (e.g., a "vertical" component can become horizontal by rotating the device).

Although the exemplary embodiments of the disclosed method may be described in a particular, sequential order for convenient presentation, it should be understood that disclosed embodiments can encompass an order of operations other than the particular, sequential order disclosed. For example, operations described sequentially may, in some cases, be rearranged or performed concurrently. The figures described herein are drawn for clear illustration of the invention and are not necessarily drawn to scale. The same reference numerals are used throughout the figures to indicate similar or identical features.

Disclosed herein are embodiments of a method for electrically connecting an integrated circuit to a via. Also disclosed are embodiments of an integrated circuit and substrate assembly. Some embodiments of the disclosed method include forming a wire bond over a via. This eliminates the need for a trace connecting the via to a bond pad on an internal surface of the substrate. Eliminating these traces can reduce signal reflection noise and improve electrical performance. In addition, eliminating these traces can allow the substrate to be more compact.

The interiors of vias typically are plated or filled with conductive material. Surface tension can cause the conductive material to form an uneven surface that interferes with wire bonding. For example, direct wire bonding to an uneven via surface using a conventional stitch can result in an unstable and unreliable connection. Some embodiments of the disclosed method eliminate this problem. Certain embodiments include deforming a ball over the via, such that the ball's material conforms to irregularities in the surface of the via. For example, an end of a bond wire can be formed into a ball and then deformed over a via. Alternatively, a ball not connected to a bond wire can be deposited and deformed over a via, such as by using a capillary dropper. In the latter case, a bond wire can be attached after the ball has been deposited, such as by wedge bonding or stitch bonding. Conductive layers, such as an upper metal plating can be present between the via itself and the deformed ball. Additionally or alternatively, the conductive material plating or filling the via may be extended across the top of the via to define a portion of the via referred to as a via cap. These wire attachment techniques can produce a stable and reliable connection when performed on a deposited ball.

FIGS. 1A-1D illustrate one embodiment of a disclosed method for connecting a substrate via to a bond pad of an integrated circuit. The illustrated assembly includes an integrated circuit 100 with a bond pad 102. The integrated circuit 100 is effectively coupled to a substrate 106 by a support structure 104. The substrate 106 includes an upper protective layer 108, a core layer 110, and a lower protective layer 112. A via 114 extends through at least a portion of substrate 106; in FIGS. 1A-1D, via 114 extends through core layer 110. Via 114 may extend from a top metal cap 116 to a bottom metal cap 118. Top metal cap 116 may also be referred to as via cap 116. Bottom metal cap 118 may also be referred to as bottom metal layer 118. As seen in FIGS. 1A-1D, top metal cap 116 substantially covers the top of via 114. Top metal cap 116 can further extend along a first surface of core layer 110 such that the footprint of top metal cap 116 is larger than the footprint of via 114. Similarly, bottom metal layer 118 can substantially cover the bottom of via 114. Bottom metal layer 118 can further extend along a second surface of core layer 110 such that the footprint of bottom metal layer 118 is larger than the footprint of via 114. Additionally, the footprint of bottom metal layer 118 can be smaller than, larger than, or substantially the same size as the footprint of top metal cap 116.

An upper plating 120, can be positioned directly over top metal cap 116 and exposed to an interior of the assembly. In contrast, in the embodiment seen in FIGS. 1A-1D, lower protective layer 112 covers, or at least substantially covers, the portion of bottom metal layer 118 directly below via 114. Bottom metal layer 118 optionally extends laterally to a lower plating 122 directly connected to an external bump 124 extending through the lower protective layer 112. Via 114 can include a peripheral metal layer 126 connecting the top metal cap 116 to the bottom metal layer 118, and a via filler 128. As seen in FIGS. 1A-1D, top metal cap 116 is electrically connected to bottom metal layer 118 by the peripheral metal layer 126.

As shown in FIG. 1A, the illustrated embodiment of the disclosed method begins by forming a ball 130 at the tip of a capillary 132. Arrow 133 indicates the direction of movement of the capillary 132. As shown in FIG. 1B, the ball 130 is deposited onto the upper plating 120 to form a substrate bump 134. The upper plating 120 includes an indentation representing the unevenness typically present directly over a via. The substrate bump 134 conforms to the indentation and provides a substantially convex surface for connection to a bond wire. As shown in FIG. 1C, a first end of a wire 136 is formed into a ball and then bonded to the bond pad 102 of the integrated circuit 100 to form an integrated circuit bump 138. Again, arrow 133 indicates the direction of movement of the capillary 132. A second end of the wire 136 opposite to the end connected to the integrated circuit 100 is connected to the substrate bump 134 using a stitch form, as shown in FIG. 1D. The method shown in FIGS. 1A-1D can be repeated as many times as necessary.

Figure 2B:
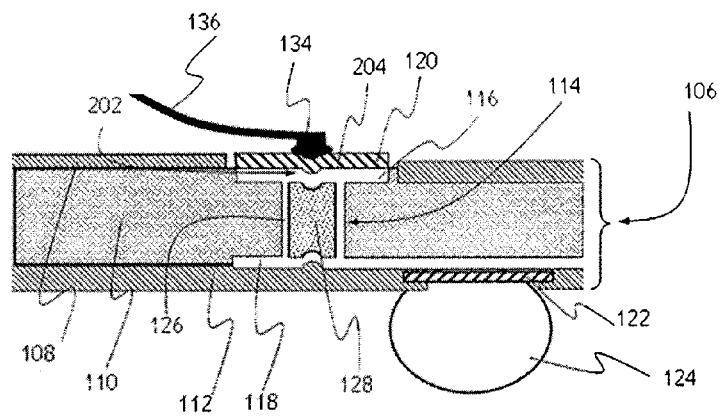
FIG. 2B is an enlargement of a portion of FIG. 2A.

FIG. 2A is a cross-sectional profile view of the assembly shown in FIG. 1D with wire bond connections on both sides of the integrated circuit 100. FIG. 2B is an enlarged view of one of the vias 114 and surrounding structures. The ton metal can 116 is shown having a dimple 202 in a top surface 204.

FIGS. 3A-3E illustrate another embodiment of a disclosed method for connecting a substrate via to a bond pad of an integrated circuit. The illustrated embodiment is similar to that shown in FIGS. 1A-1D, except the integrated circuit bump 138 is formed prior to the substrate bump 134 and the wire 136 is extended from the substrate bump 134 to the integrated circuit bump 138, rather than from the integrated circuit 100 to the substrate bump. Thus substrate bump 134 is a portion of wire 136.

Prior to formation of the wire bond, the illustrated assembly of FIGS. 3A-3E is identical to the assembly shown in FIG. 1A. As shown in FIGS. 3A-3B, a ball 130 is formed at the tip of the capillary 132 and then deposited onto the bond pad 102 to form the integrated circuit bump 138. As shown in FIGS. 3C-3D, a first end of a wire 136 is formed into a ball and bonded to the upper plating 120 to form the substrate bump 134. As shown in FIG. 3E, a second end of the wire 136 opposite to the first end is connected to the integrated circuit bump 138 using a stitch form.

Figure 4A:
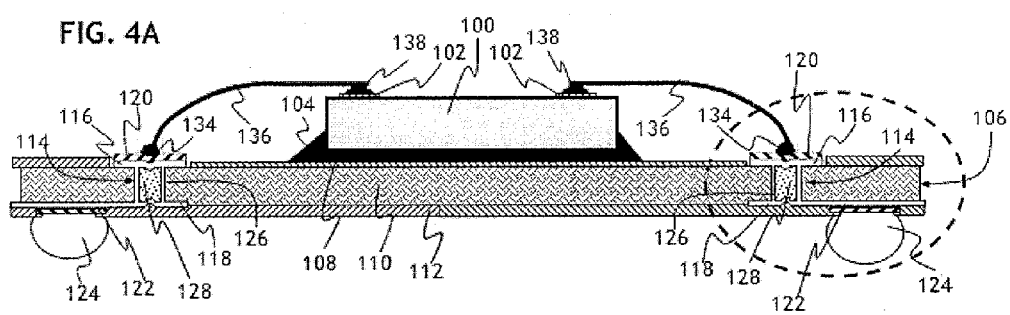
FIG. 4A is a cross-sectional profile view of an integrated circuit and substrate assembly made by one embodiment of the method, as shown in FIGS. 3A-3E.
Figure 4B:
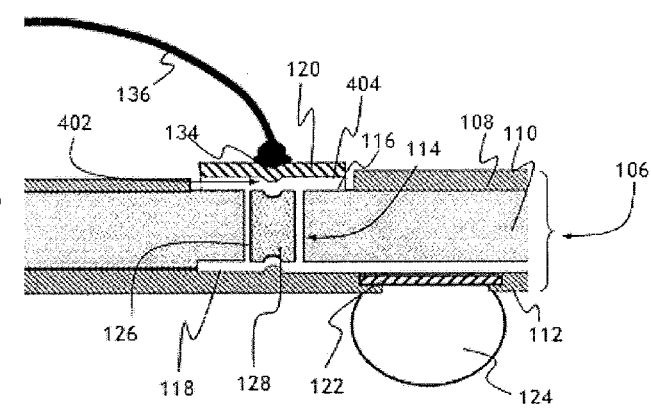
FIG. 4B is an enlargement of a portion of FIG. 4A.

FIG. 4A is a cross-sectional profile view of the assembly shown in FIG. 3E with wire bond connections on both sides of the integrated circuit 100. FIG. 4B is an enlarged view of one of the vias 114 and surrounding structures. The via cap 116, or metal cap, replaces a portion of the upper protective layer 108 of the substrate 106 over the via 114 and is recessed in the surface of the substrate 106 below the upper surface of the upper protective layer 108. The via cap 116 is in direct contact with and covers a portion of the core layer 110 of the substrate 106 around the via 114. The upper plating 120 is formed over the via cap 116, and may protrude above the upper surface of the upper protective layer 108. Similarly, the bottom via cap, such as the metal layer 118, is formed over the other end of the via 114 and is recessed in the surface of the substrate 106 below the lower protective layer 112 of the substrate 106. The top metal cap 116 is shown having a dimple 402 in a top surface 404.

Conventional techniques can be used to form the wire bonds in embodiments of the disclosed method. For example, in some embodiments, an end of a bond wire first is converted into a ball shape, such as by application of an electronic flame-off. The ball then can be held at the connection point while pressure, heat and/or ultrasonic energy is applied. This causes deformation of the ball and potentially interdiffusion between the ball material and the connection point material. For example, the ball material can interdiffuse with the material of the bond pad or upper plating. After the end of the wire on which the ball was formed is bonded, the other end can be attached by another method. For example, the end of the wire opposite to the ball-bonded end can be attached using a wedge bond or a stitch bond.

Figure 5A:
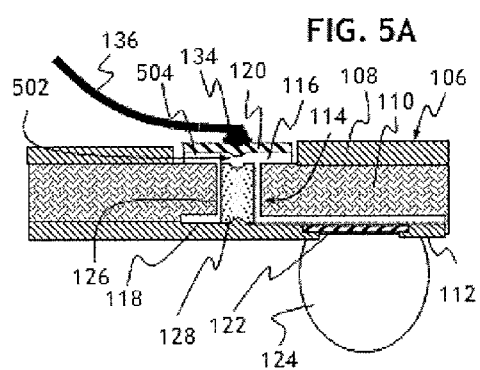
FIGS. 5A-5D are cross-sectional profile views of different configurations of vias in substrates wire bonded to integrated circuits by embodiments of the disclosed method.
Figure 5B:
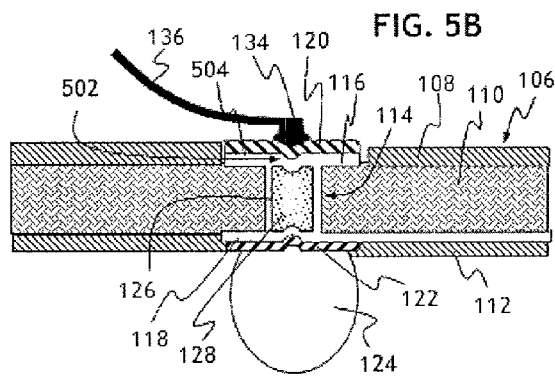
Figure 5C:
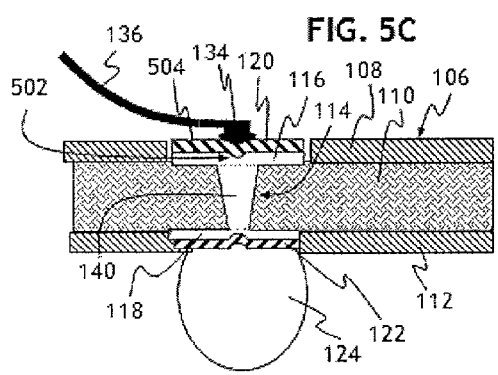
Figure 5D:
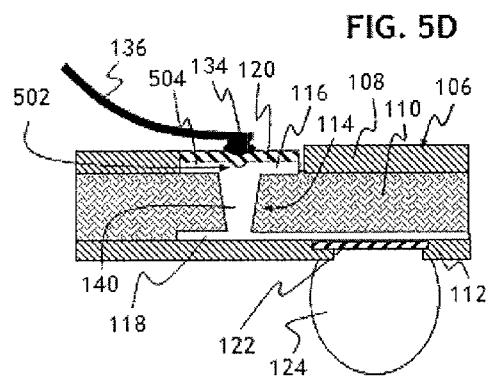

Embodiments of the disclosed method can be used in connection with a variety of different integrated circuit packaging assemblies. FIGS. 5A-5D illustrate vias 114 and surrounding structures of four such assemblies. These assemblies show the top metal cap 116 is shown having a dimple 502 in a top surface 504. In FIG. 5A, the bottom metal layer 118 does not extend below the via filler 128, but does contact the peripheral metal layer 126 of the via 114. In FIG. 5B, the lower plating 122 and the external bump 124 are positioned directly under the via 114. In FIGS. 5C and 5D, the vias 114 are wedge shaped, which is indicative of laser drilling. Rather than incorporating a peripheral metal layer and a via filler, the vias 114 include metal wedges 140 between the top metal cap 116 and the bottom metal layer 118. In FIG. 5C, the external bump 124 is positioned directly under the via 114. In FIG. 5D, the external bump 124 is laterally spaced apart from the via 114.

In addition to the variations shown in FIGS. 5A-5D, some assemblies compatible with embodiments of the disclosed method include no upper plating 120, lower plating 122, and/or via filler 128. In addition, the external bump 124 can be replaced with another type of connector, such as a pin. Although the substrates 106 shown in FIGS. 1-5 include three layers, embodiments of the disclosed method are compatible with assemblies including substrates having any number of layers. Further, some layers may be metallized on one or both surfaces, while others may not be. Vias may extend through all of the layers present in a substrate assembly, or through only some of the layers.

Further, while FIGS. 1-5 depict assemblies where only one via 114 is visible, assemblies may include a plurality of vias 114. In embodiments including a plurality of vias, the first surface of the substrate can include substantially no lateral traces connected to the vias.

Suitable materials for the integrated circuit bond pad 102, the top metal cap 116, the bottom metal layer 118, the upper plating 120, the lower plating 122, the external bump 124, and the peripheral metal layer 126 include metals, such as copper, nickel, aluminum and alloys thereof. Suitable materials for the support structure 104, the upper protective layer 108, the lower protective layer 112, and the via filler 128 include polymeric materials, such as epoxies and acrylics. The core layer 110 can include, for example, resin-impregnated fiberglass. Suitable materials for the substrate bump 134, the integrated circuit bump 136, and the wire 138 include metals, such as gold, copper, aluminum, and alloys or combinations thereof. In some assemblies, the materials of the upper plating 120 and the lower plating 122 are selected to form an intermetallic bond with the substrate bump 134 and the external bump 124, respectively. Of course, materials other than those listed also can be used in the various assemblies compatible with embodiments of the disclosed method.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A method for manufacturing an integrated circuit and substrate assembly, comprising:
   providing a substrate having an upper surface, a core layer, and a lower surface;
   forming a via in the substrate, the via having a first end and a second end;
   providing a first via cap having a dimple in a top surface and recessed in the upper surface of the substrate over the first end of the via and in direct contact with the core layer;
   providing a second via cap recessed in the lower surface of the substrate over the second end of the via; and
   deforming a ball over the via cap to form a bump.

2. The method according to claim 1, wherein the first via cap is coated with a metal plating.

3. The method according to claim 1, wherein the via is a blind via.

4. The method according to claim 1, wherein the via is a wedge via.

5. The method according to claim 1, further comprising attaching a bond wire to the bump wherein attaching the bond wire comprises at least one of forming a wedge bond, a stitch bond, or a combination thereof between the bond wire and the bump.

6. The method according to claim 1, further comprising attaching the bond wire to the integrated circuit.

7. The method according to claim 6, wherein the ball is a first ball, and attaching the bond wire to the integrated circuit comprises:
   forming an end of the bond wire into a second ball; and
   deforming the second ball over the integrated circuit.

8. A method for manufacturing an integrated circuit and substrate assembly, comprising:
   providing a substrate having an upper surface, a core layer, and a lower surface;
   forming a via in the substrate, the via having a first end and a second end;
   providing a first via cap having a dimple in a top surface and recessed in the upper surface of the substrate over the first end of the via and in direct contact with the core layer;
   providing a second via cap recessed in the lower surface of the substrate over the second end of the via;
   forming an end of a bond wire into a ball; and
   deforming the ball over at least one of the via caps.

9. The method according to claim 8, further comprising attaching the bond wire to the integrated circuit.

10. The method according to claim 9, wherein the ball is a first ball, the method further comprises deforming a second ball over the integrated circuit to form a bump, and attaching the bond wire to the integrated circuit comprises attaching the bond wire to the bump.

11. The method according to claim 10, wherein attaching the bond wire to the bump comprises forming at least one of a wedge bond, a stitch bond, or a combination thereof between the bond wire and the bump.

12. An integrated circuit and substrate assembly, comprising:
   a substrate with a core layer and a via electrically connecting a metal layer on a first surface of the substrate to a metal layer on a second surface of the substrate;
   a via cap having a dimple in a top surface and under the surface of the metal layer over the via on the first surface of the substrate and in direct contact with the core layer of the substrate;
   an integrated circuit mounted on the first surface of the substrate;
   a bump substantially aligned with at least a portion of the via cap; and
   a bond wire attached to the integrated circuit and the bump.

13. The integrated circuit and substrate assembly according to claim 12, wherein the substrate includes a plurality of vias and the first surface of the substrate includes substantially no lateral traces connected to the vias.

14. The integrated circuit and substrate assembly according to claim 12, wherein the via is a blind via.

15. The integrated circuit and substrate assembly according to claim 12, wherein the bump is a portion of the bond wire.

16. The integrated circuit and substrate assembly according to claim 15, wherein the bump is a first bump, the integrated circuit and substrate assembly includes a second bump on the integrated circuit, and the bond wire is attached to the second bump by a wedge or stitch bond.

17. The integrated circuit and substrate assembly according to claim 12, wherein the bond wire is attached to the bump by at least one of a wedge bond, a stitch bond, or a combination thereof.

18. The integrated circuit and substrate assembly according to claim 17, wherein the bump is a first bump, the integrated circuit and substrate assembly includes a second bump on the integrated circuit, and the second bump is a portion of the bond wire.

19. An integrated circuit and substrate assembly, comprising:
   an integrated circuit;
   a substrate with at least an upper protective layer, a lower protective layer, and a core layer;
   a via in the substrate with a top metal cap having a dimple in a top surface and recessed in the upper protective layer in direct contact with the core layer and an upper plating directly thereover;
   a bump over the top metal cap; and
   a bond wire from the integrated circuit to the bump.

20. The integrated circuit and substrate assembly according to claim 19 wherein the substrate comprises multiple layers, and the via extends through all of the layers.

21. The integrated circuit and substrate assembly according to claim 19 wherein the via is a wedge via.

22. The integrated circuit and substrate assembly according to claim 19 wherein the via has a bottom metal cap.

23. The integrated circuit and substrate assembly according to claim 22 further comprising a bottom metal layer electrically connected to the bottom metal cap.

24. The integrated circuit and substrate assembly according to claim 22 wherein the lower protective layer of the substrate is not metallized and the bottom metal cap is electrically connected to an external bump.

25. An integrated circuit and substrate assembly, comprising:
   a substrate that comprises a core layer, an upper protective layer on a first surface of the core layer, and a lower protective layer on a second surface of the core layer;
   an integrated circuit;
   a metallized via extending between the first and second surfaces of the core layer, where the upper protective layer does not cover the metallized via;
   a top metal via cap having a dimple in a top surface and recessed in the upper protective layer covering the metallized via adjacent to the first surface of the core layer and extending to cover a portion of the first surface of the core layer and in direct contact therewith;
   an upper metal plating covering at least a portion of the top metal via cap;
   a bottom metal via cap covering the metallized via adjacent to the second surface of the core layer and extending to cover at least a portion of the second surface of the core layer; and
   a bottom metal layer covering at least a portion of the bottom metal via cap, where the bottom metal layer is electrically connected to an external bump.

* * * * *

UNITED STATES PATENT AND TRADEMARK OFFICE
CERTIFICATE OF CORRECTION

| | | |
|---|---|---|
| PATENT NO. | : 8,021,931 B2 | Page 1 of 1 |
| APPLICATION NO. | : 11/943290 | |
| DATED | : September 20, 2011 | |
| INVENTOR(S) | : Filoteo, Jr. et al. | |

It is certified that error appears in the above-identified patent and that said Letters Patent is hereby corrected as shown below:

Column 4:

lines 43-44, delete "The ton metal can 116 is shown" and insert therefor --The top metal cap 116 is shown--

Signed and Sealed this
Twenty-ninth Day of May, 2012

David J. Kappos
*Director of the United States Patent and Trademark Office*